United States Patent
Takahashi et al.

(10) Patent No.: US 9,074,283 B2
(45) Date of Patent: Jul. 7, 2015

(54) ION GUN SYSTEM, VAPOR DEPOSITION APPARATUS, AND METHOD FOR PRODUCING LENS

(75) Inventors: Yukihiro Takahashi, Tokyo (JP);
Terufumi Hamamoto, Akishima (JP);
Kenichi Shinde, Hussa (JP)

(73) Assignee: HOYA CORPORATION, Tokyo (JP)

(*) Notice: Subject to any disclaimer, the term of this patent is extended or adjusted under 35 U.S.C. 154(b) by 1129 days.

(21) Appl. No.: 12/225,416

(22) PCT Filed: Mar. 28, 2007

(86) PCT No.: PCT/JP2007/056719
§ 371 (c)(1),
(2), (4) Date: Sep. 22, 2008

(87) PCT Pub. No.: WO2007/114188
PCT Pub. Date: Oct. 11, 2007

(65) Prior Publication Data
US 2009/0169766 A1     Jul. 2, 2009

(30) Foreign Application Priority Data
Mar. 31, 2006   (JP) ................. 2006-096767

(51) Int. Cl.
*C23C 14/54*   (2006.01)
*C23C 14/22*   (2006.01)
(Continued)

(52) U.S. Cl.
CPC . *C23C 14/32* (2013.01); *G02B 1/11* (2013.01); *C23C 14/54* (2013.01); *H01J 2237/022* (2013.01); *C23C 14/564* (2013.01);
(Continued)

(58) Field of Classification Search
None
See application file for complete search history.

(56) References Cited

U.S. PATENT DOCUMENTS 5,455,081 A * 10/1995 Okada et al. ............. 216/66
5,581,156 A    12/1996 Roberts et al.
(Continued)

FOREIGN PATENT DOCUMENTS

JP   A-02-298254   12/1990
JP   A-04-136155    5/1992
(Continued)

OTHER PUBLICATIONS

Supplementary European Search Report issued in European Patent Application No. 07 74 0157 dated Feb. 10, 2011.
(Continued)

*Primary Examiner* — Dah-Wei D Yuan
*Assistant Examiner* — Binu Thomas
(74) *Attorney, Agent, or Firm* — Oliff PLC

(57) ABSTRACT

An ion gun system includes an ion gun for irradiating an ion beam; an electric power supply unit for supplying electric power to the ion gun; two mass flow regulators for introducing each of two types of gas in the ion gun; a control unit connected to the electric power supply unit for working as ion gun control means for controlling electric power supplied to the ion gun from the electric power supply unit; and a control unit connected to the mass flow regulators for working as mass flow control means for controlling the flow rate of gas introduced from the mass flow regulators in the ion gun. The control unit as mass flow control means is provided with a function of changing the set value for the flow rate of each of the two types of gas to another set value by changing it stepwise within a range where the ion gun is working stably. Accordingly, shortening of film formation time can be attained.

10 Claims, 5 Drawing Sheets

(51) Int. Cl.

| | | |
|---|---|---|
| *C23C 14/32* | (2006.01) | |
| *C23C 14/06* | (2006.01) | |
| *C23C 16/02* | (2006.01) | |
| *H01J 27/02* | (2006.01) | |
| *G02B 1/11* | (2006.01) | |
| *C23C 14/56* | (2006.01) | |
| *C23C 14/00* | (2006.01) | |
| *C23C 16/30* | (2006.01) | |
| *H01J 37/302* | (2006.01) | |
| *H01J 37/08* | (2006.01) | |
| *H01J 37/317* | (2006.01) | |

(52) U.S. Cl.
CPC .............. *C23C14/0042* (2013.01); *C23C 16/30* (2013.01); *H01J 27/02* (2013.01); *C23C 14/221* (2013.01); *H01J 37/08* (2013.01); *H01J 37/317* (2013.01); *C23C 14/0031* (2013.01); *H01J 37/302* (2013.01); *H01J 37/3178* (2013.01); *H01J 2237/006* (2013.01)

(56) References Cited

U.S. PATENT DOCUMENTS

| | | | | |
|---|---|---|---|---|
| 6,210,744 B1 * | 4/2001 | Hayess et al. | ............ | 204/192.16 |
| 6,225,747 B1 * | 5/2001 | Fremgen et al. | ......... | 315/111.91 |
| 2004/0146723 A1 * | 7/2004 | Mitsuishi et al. | .............. | 428/447 |
| 2006/0023311 A1 * | 2/2006 | Scherer et al. | ................. | 359/603 |
| 2008/0129209 A1 * | 6/2008 | Deakins et al. | .......... | 315/111.91 |

FOREIGN PATENT DOCUMENTS

| | | | |
|---|---|---|---|
| JP | A-06-322526 | | 11/1994 |
| JP | A-11-326634 | | 11/1999 |
| JP | A-2002-539593 | | 11/2002 |
| JP | A-2004-206024 | | 7/2004 |
| JP | A-2004-332077 | | 11/2004 |
| JP | 2006-070291 | * | 3/2006 |
| JP | A-2006-065038 | | 3/2006 |
| JP | A-2006-070291 | | 3/2006 |
| KR | 10-2004-0057951 | | 7/2004 |
| WO | WO-00/54899 | * | 9/2000 |
| WO | WO 00/54899 A1 | | 9/2000 |

OTHER PUBLICATIONS

Office Action issued in Korean Application No. 10-2008-7022415 on Sep. 7, 2011. (a partial English language translation attached).

* cited by examiner

ION GUN SYSTEM, VAPOR DEPOSITION APPARATUS, AND METHOD FOR PRODUCING LENS

TECHNICAL FIELD

The present invention relates to an ion gun system, a vapor deposition apparatus including an ion gun system, and a method for producing a lens forming a multi-layer antireflective film on a lens with use of an ion-assisted method.

BACKGROUND

Application of a multi-layer antireflective film on a plastic lens with use of an ion-assisted method is known. As an example of this, in Examples 7 to 10 of Patent Document 1, it is described that an ion-assisted method is used for forming all layers of films (high-refractive-index layers and low-refractive-index layers) that constitute a multi-layer antireflective film. In doing this, the film formation conditions (i.e. set values for acceleration voltage, acceleration current, and flow rate of gas to be used) according to the ion-assisted method are different for a high-refractive-index layer and a low-refractive-index layer, both of which constitute the multi-layer antireflective film.

[Patent Document 1] Japanese Patent Application Laid Open No. 2004-206024

DISCLOSURE OF THE INVENTION

Problem to be Solved by the Invention

Patent Document 1 does not describe how to change the film formation conditions in the case of changing from the film formation condition (i.e., set values for acceleration voltage, acceleration current, and flow rate of gas to be used) for the low-refractive-index layer according to the ion-assisted method to the film formation condition for the high-refractive-index layer according to the ion-assisted method, or in the case of changing from the film formation condition for the high-refractive-index layer according to the ion-assisted method to the film formation condition for the low-refractive-index layer according to the ion-assisted method.

For an ion gun which is used in the ion-assisted method, if the set values for the acceleration voltage, the acceleration current, the flow rate of gas to be used, or the like are changed without being controlled at all, these values for the acceleration voltage, the acceleration current, and the flow rate of gas to be used may change suddenly, which may lead to abnormality stoppage of the ion gun.

Accordingly, in the case of changing from one of the film formation conditions to the other film formation condition between the film formation condition (the set values for the acceleration voltage, the acceleration current, and the flow rate of gas to be used) for the low-refractive-index layer according to the ion-assisted method and the film formation conditions for the high-refractive-index layer according to the ion-assisted method, a method is employed in which the current set values are temporarily reset to 0, and subsequently, the set values are changed to another intended set values (see FIG. 5). Accordingly, it usually takes a lot of time for forming a multi-layer antireflective film according to the ion-assisted method for which the film formation conditions are different for the low-refractive-index layer and the high-refractive-index layer.

An object of the present invention, which has been made in consideration of the foregoing situations, is to provide an ion gun system which can reduce film formation time without deteriorating performance of a film formed on a film-formed body, and a vapor deposition apparatus including the ion gun system. Another object of the present invention is to provide a method for producing a lens which can reduce film formation time of a multi-layer antireflective film without deteriorating performance of the multi-layer antireflective film to be formed on a lens substrate.

Means for Solving Problems

The ion gun system of the invention according to Claim 1 is an ion gun system including: an ion gun for irradiating an ion beam; an electric power supply unit for supplying electric power to the ion gun; a plurality of mass flow regulators for introducing each of a plurality of types of gas in said ion gun; ion gun control means, connected to said electric power supply unit, for controlling electric power supplied to said ion gun from the electric power supply unit; and mass flow control means, connected to said mass flow regulators, for controlling the flow rate of gas introduced in said ion gun from the mass flow regulators, wherein said mass flow control means is provided with a function of changing a set value for the flow rate of each of a plurality of types of gas to another set value by changing it stepwise within a range where said ion gun is working stably.

The ion gun system of the invention according to Claim 2 relates to the ion gun system according to Claim 1, wherein said mass flow control means is provided with a function of changing the set value for the flow rate of each of a plurality of types of gas to another set value by changing it stepwise while synchronizing the set values within a range where said ion gun is working stably.

The ion gun system of the invention according to Claim 3 relates to the ion gun system according to Claim 1 or 2, wherein said mass flow control means is provided with a function of changing the set value for the flow rate of each of a plurality of types of gas to another set value by changing it stepwise within a range where said ion gun is working stably, while maintaining a constant total flow rate.

The ion gun system of the invention according to Claim 4 relates to the ion gun system according to any one of Claim 1 to 3, wherein said ion gun control means is provided with a function of changing the set value for each of an acceleration current value and an acceleration voltage value supplied to said ion gun to another set value by changing it stepwise within a range where said ion gun is working stably.

The ion gun system of the invention according to Claim 5 relates to the ion gun system according to any one of Claim 1 to 4, wherein said ion gun control means is provided with a function of temporarily setting the set value for each of the acceleration current value and the acceleration voltage value supplied to said ion gun to values that satisfy 30 mA≤the acceleration current value≤70 mA and 100 V≤the acceleration voltage value≤160 V by changing it stepwise within a range where said ion gun is working stably, and subsequently changing it stepwise it to another set value.

The ion gun system of the invention according to Claim 6 relates to the ion gun system according to any one of Claim 1 to 5, wherein change by said ion gun control means of the setting values for the acceleration current value and the acceleration voltage value supplied to the ion gun and change by said mass flow control means of the setting value for the flow rate of gas introduced in the ion gun are implemented in parallel.

The ion gun system of the invention according to Claim 7 relates to the ion gun system according to any one of Claim 1 to 6, wherein at least one of change by said ion gun control means of the set values for the acceleration current value and the acceleration voltage value supplied to the ion gun and change by said mass flow control means of the set value for the flow rate of gas introduced in the ion gun is to change said set value separately per a divided unit time determined by dividing a total change time for each of the values, so as to change said set value stepwise within said total change time, and said divided unit time is set to be a time period equal to or less than 1 second.

A vapor deposition apparatus of the invention according to Claim 8 is a vapor deposition apparatus, including a vapor deposition chamber which holds a film-formed body therein; a heat source, installed in the vapor deposition chamber, for heating a vapor deposition material to evaporate it and depositing it on said film-formed body; and an ion gun system, installed in the vapor deposition chamber, for assisting said vapor deposition onto said film-formed body with an ion beam it irradiates, wherein said ion gun system is an ion gun system according to any one of Claims 1 to 7.

A method for producing a lens of the invention according to Claim 9 is a method for producing a lens, including: while forming a multi-layer antireflective film consisting of a high-refractive-index layer and a low-refractive-index layer on the lens substrate according to an ion-assisted method with use of an ion gun, making a set value for each of an acceleration current value and an acceleration voltage value supplied to said ion gun and a set value for a flow rate of each of a plurality of types of gas introduced in said ion gun different between when forming said high-refractive-index layer and when forming said low-refractive-index layer, wherein the method changes the set value for the flow rate of each of a plurality of types of gas to another set value by changing it stepwise within a range where said ion gun is working stably, during a period between when forming the high-refractive-index layer and when forming the low-refractive-index layer.

The method for producing a lens of the invention according to Claim 10 relates to the method according to Claim 9, wherein the method changes the set value for the flow rate of each of a plurality of types of gas to another set value by changing it stepwise while synchronizing the set values within a range where said ion gun is working stably, during a period between when forming the high-refractive-index layer and when forming the low-refractive-index layer.

The method for producing a lens of the invention according to Claim 11 relates to the method according to Claim 9 or 10, wherein the method changes the set value for the flow rate of each of a plurality of types of gas to another set value by changing it stepwise within a range where said ion gun is working stably, while maintaining a constant total flow rate, during a period between when forming the high-refractive-index layer and when forming the low-refractive-index layer.

The method for producing a lens of the invention according to Claim 12 relates to the method according to any one of Claims 9 to 11, wherein the method changes the set value for each of an acceleration current value and an acceleration voltage value supplied to said ion gun to another set value by changing it stepwise within a range where said ion gun is working stably, during a period between when forming the high-refractive-index layer and when forming the low-refractive-index layer.

The method for producing a lens of the invention according to Claim 13 relates to the method according to any one of Claims 9 to 12, wherein the method temporarily sets the set value for each of the acceleration current value and the acceleration voltage value supplied to said ion gun to values that satisfy 30 mA≤the acceleration current value≤70 mA and 100 V≤the acceleration voltage value≤160 V by changing it stepwise within a range where said ion gun is working stably, and subsequently changing it stepwise it to another set value, during a period between when forming the high-refractive-index layer and when forming the low-refractive-index layer.

The method for producing a lens of the invention according to Claim 14 relates to the method according to any one of Claims 9 to 13, wherein change by said ion gun control means of the setting values for the acceleration current value and the acceleration voltage value supplied to the ion gun and change by said mass flow control means of the setting value for the flow rate of gas introduced in the ion gun are implemented in parallel, during a period between when forming the high-refractive-index layer and when forming the low-refractive-index layer.

The method for producing a lens of the invention according to Claim 15 relates to the method according to any one of Claims 9 to 14, wherein at least one of change by said ion gun control means of the set values for the acceleration current value and the acceleration voltage value supplied to the ion gun and change by said mass flow control means of the set value for the flow rate of gas introduced in the ion gun is to change said set value separately per a divided unit time determined by dividing a total change time for each of the values, so as to change said set value stepwise within said total change time, during a period between when forming the high-refractive-index layer and when forming the low-refractive-index layer, and said divided unit time is set to be a time period equal to or less than 1 second.

Effect of the Invention

According to the invention of Claims 1, 2, 3, 7 or 8, the mass flow control means is provided with a function of changing the set value for the flow rate of each of a plurality of types of the gas to another set value by changing it stepwise within a range where the ion gun is working stably. In this way, the mass flow control means changes the set value for the flow rate of gas to another set value by changing it stepwise, without changing the set value to another set value after temporarily setting it to 0. Accordingly, a film formation time for forming a film-formed body with use of the ion gun can be reduced without deteriorating performance of the film. In addition, since stable working of the ion gun is ensured when changing the set value for the flow rate of gas to be introduced, a situation where the ion gun abnormally stops when changing the set value can be reliably avoided.

According to the invention of Claim 4, 7 or 8, the ion gun control means changes the set value for each of an acceleration current value and an acceleration voltage value supplied to the ion gun to another set value by changing it stepwise within a range where the ion gun is working stably. In this way, the ion gun control means changes the set value for each of the acceleration current value and the acceleration voltage value to another set value by changing it stepwise, without changing the set value to another set value after temporarily setting it to 0. Accordingly, a film formation time for forming a film-formed body with use of the ion gun can be reduced without deteriorating performance of the film. In addition, since stable working of the ion gun is ensured when changing the set value for each of the acceleration current value and the acceleration voltage value, a situation where the ion gun abnormally stops when changing the set value can be reliably avoided.

According to the invention of Claim 5, the ion gun control means executes a so called power down in which it sets the set value for each of the acceleration current value and the acceleration voltage value supplied to the ion gun to values that satisfy 30 mA≤the acceleration current value≤70 mA and 100 V≤the acceleration voltage value≤160 V, before changing it to another set value. Accordingly, even if an error occurs in other equipment while the power-down is being executed, the influence of the ion beam irradiated from the ion gun on a film that has been already formed on the film-formed body can be avoided as much as possible.

According to the invention of Claim 6, change by the ion gun control means of the setting values for the acceleration current value and the acceleration voltage value supplied to the ion gun and change by the mass flow control means of the setting value for the flow rate of gas introduced in the ion gun are implemented in parallel. Accordingly, change of the set values for the ion gun can be implemented during a short period of time, and thus a film formation time can be reduced.

According to the invention of Claims 9, 10, 11 or 15, the method changes the set value for the flow rate of each of a plurality of types of gas to another set value by changing it stepwise within a range where the ion gun is working stably, during a period between when forming the high-refractive-index layer and when forming the low-refractive-index layer of the multi-layer antireflective film. In this way, the method changes the set value for the flow rate of gas to another set value by changing it stepwise, without changing the set value to another set value after temporarily setting it to 0. Accordingly, a film formation time for forming a multi-layer antireflective film on the lens substrate with use of the ion gun can be reduced without deteriorating performance of the film. In addition, since stable working of the ion gun is ensured when changing the set value for the flow rate of gas to be introduced, a situation where the ion gun abnormally stops when changing the set value can be reliably avoided.

According to the invention of Claim 12 or 15, the method changes the set value for each of an acceleration current value and an acceleration voltage value supplied to the ion gun to another set value by changing it stepwise within a range where the ion gun is working stably, during a period between when forming the high-refractive-index layer and when forming the low-refractive-index layer. In this way, the method changes the set value for each of the acceleration current value and the acceleration voltage value to another set value by changing it stepwise, without changing the set value to another set value after temporarily setting it to 0. Accordingly, a film formation time for forming a multi-layer antireflective film on the lens substrate with use of the ion gun can be reduced without deteriorating performance of the film. In addition, since stable working of the ion gun is ensured when changing the set value for each of the acceleration current value and the acceleration voltage value, a situation where the ion gun abnormally stops when changing the set value can be reliably avoided.

According to the invention of Claim 13, the method executes a so called power-down in which it sets the set value for each of the acceleration current value and the acceleration voltage value supplied to the ion gun to values that satisfy 30 mA≤the acceleration current value≤70 mA and 100 V≤the acceleration voltage value≤160 V, before changing it to another set value, during a period between when forming the high-refractive-index layer and when forming the low-refractive-index layer. Accordingly, even if an error occurs in other equipment while the power-down is being executed, the influence of the ion beam irradiated from the ion gun on a film that has been already formed on the film-formed body can be avoided as much as possible.

According to the invention of Claim 14, change by the ion gun control means of the setting values for the acceleration current value and the acceleration voltage value supplied to the ion gun and change by the mass flow control means of the setting value for the flow rate of gas introduced in the ion gun are implemented in parallel, during a period between when forming the high-refractive-index layer and when forming the low-refractive-index layer of the multi-layer antireflective film. Accordingly, change of the set values supplied to the ion gun can be implemented during a short period of time, and a film formation time can be reduced.

BEST MODE FOR CARRYING OUT THE INVENTION

Hereinafter, the best mode for carrying out the present invention will be explained with reference to the drawings.

FIG. 1 shows one example in which the present invention has been applied to a continuous vapor deposition system 1 which continuously forms a thin film such as an antireflective film, a water proof coat, or the like on a plastic lens for eyeglass. The continuous vapor deposition system 1 continuously forms an antireflective film and a water proof coat or the like through vapor deposition of a vapor deposition material on a lens for eyeglass (hereinafter, merely referred to as "lens") as a molded film-formed body in a vacuum vapor deposition chamber.

FIG. 1 is a schematic diagram showing an outline of the continuous vapor deposition system 1. The continuous vapor deposition system 1 includes a preheating unit 100 for heating a lens 20, a first vapor deposition apparatus 200 for forming an antireflective film on the lens 20, and a second vapor deposition apparatus 300 for forming a water proof coat or the like on the lens 20 on which the antireflective film has been formed. In addition, a vacuum unit (for example, denoted by numeral 8 in FIG. 2) is arranged in each of the preheating unit 100, the first vapor deposition apparatus 200, and the second vapor deposition apparatus 300, so as to satisfy a predetermined degree of vacuum.

An outline of a film formation process of the lens 20 in the continuous vapor deposition system 1 will be described.

First, a plurality of the lens 20 are arranged on a disk-like coating dome 2, so that the lens 20 constitutes one lot. Next, the coating dome 2 is placed on a support table 101 of the preheating unit 100. The coating dome 2 is caused to rise in tandem with the support table 101, so that it is moved from the bottom portion of the preheating unit 100 to the inside of the preheating unit 100. When rise of the coating dome 2 and the support table 101 is completed, the bottom portion of the preheating unit 100 is sealed by an opening and closing table 103 which supports the lower portion of the support table 101. Meanwhile, the coating dome 2, supported by transfer means (not shown in FIG. 1) provided in the continuous vapor deposition system 1, is transferable from the preheating unit 100 via the first vapor deposition apparatus 200 to the second vapor deposition apparatus 300. In addition, the transfer means, supported by the coating dome 2, is rotatable by an actuator which is not shown.

The preheating unit 100 preheats the lenses 20 on the coating dome 2 with use of a heater (such as halogen heater) 102 driven by a control unit 12. When preheating is completed, the control unit 12 drives the transfer means to transfer the coating dome 2 to the first vapor deposition apparatus 200.

In the first vapor deposition apparatus 200, electron guns 30, 31 working as heat source heat a plurality of vapor deposition materials 41, 42 to evaporate them, thereby to form mainly an antireflective film on the lens 20. Note that driving of the electron guns 30, 31 and selection of the vapor deposition materials 41, 42 is controlled by the control unit 12. In addition, an optical film thickness meter 10 is provided for monitoring the status of thin film formation in the first vapor deposition apparatus 200. The monitoring result is sent to the control unit 12, where it is used for control of the electron guns 30, 31 or other purposes.

When formation of the antireflective film is completed, the control unit 12 drives the transfer means to transfer the coating dome 2 to the second vapor deposition apparatus 300. In the second vapor deposition apparatus 300, a supporting table 301 for supporting the coating dome 2 is arranged movably on an opening and closing table 303 which can be lifted and lowered. The coating dome 2 which has been transferred from the first vapor deposition apparatus 200 is further transferred to the second vapor deposition apparatus 300 by the transfer means.

A heater (such as halogen heater) 302 which is controlled by the control unit 12 and a vapor deposition material 340 which is heated by the heater 302 are arranged on the opening and closing table 303 of the second vapor deposition apparatus 300, and a water proof coat is formed on the lens 20 arranged in the coating dome 2. When formation of the water proof coat on the lens 20 is completed, the opening and closing table 303 is lowered and processing of all processes is complete. After this, the coating dome 2 is transferred from the supporting table 301, and the lens 20 on the coating dome 2 is carried to the next process.

FIG. 2 shows the first vapor deposition apparatus 200 and the control unit 12.

In the vapor deposition chamber 201 of the first vapor deposition apparatus 200, the coating dome 2 including the lens 20 which has been transferred from the preheating unit 100 is positioned and held at the upper portion in the vapor deposition chamber 201.

At the lower portion of the vapor deposition chamber 201, there is provided a hearth portion 400 having a container 40 including a crucible and a hearth that accommodate the vapor deposition materials (film formation materials) 41, 42, the electron guns 30, 31 working as the heat source for irradiating an electron beam to the vapor deposition materials 41, 42 in the container to evaporate, a shutter 5 for the electron gun which selectively shuts off vapor of the vapor deposition materials 41, 42, an ion gun 14 for assisting vapor deposition by irradiating an ion beam in order to improve strength and film quality (such as denseness) of a thin film to be vapor deposited, a gas generation unit (gas unit) 15 which fills gas in the vapor deposition chamber 201 in order to improve strength and film quality of a vapor-deposited thin film and the like.

Note that an actuator (not shown) is provided in the shutter 5 for the electron gun, and is controlled by the control unit 12 to be described later. Meanwhile, the vapor deposition materials 41, 42 are substances of different types. For example, the vapor deposition material 41 is a low-refractive-index layer, and the vapor deposition material 42 is a high-refractive-index layer.

In the vicinity of the coating dome 2 at the upper portion of the vapor deposition chamber 201, a substrate thermometer 6 is provided for measuring a temperature of the lens 20 as the film-formed body which is held by the coating dome 2. Further, a vacuum meter 7 for measuring degree of vacuum in the vapor deposition chamber 201, and an exhaust unit (vacuum unit) 8 for exhausting the vapor deposition chamber 201. In addition, in the vicinity of the coating dome 2 at the upper portion of the vapor deposition chamber 201, a heater 9 is provided for heating the lens 20 which is held by the coating dome 2. The heater 9 includes a halogen heater or the like.

At the upper portion of the vapor deposition chamber 201, there is installed a monitor glass 51 at a predetermined position which is a component of the optical film thickness meter 10 detecting a status of thin film formation. The monitor glass 51, which is arranged at a predetermined position in the vapor deposition chamber 201, can receive vapor of the vapor deposition materials 41, 42.

Further, outside above the vapor deposition chamber 201, the optical film thickness meter 10 is provided for measuring reflectance of the monitor glass 51 which is installed at a predetermined position with respect to the coating dome 2. The optical film thickness meter 10 is connected to the control unit 12 via a film thickness monitor 11. The optical film thickness meter 10 outputs the ratio of the light quantity of reflected light with respect to the light quantity of irradiated light as the light quantity data (light quantity value) to the control unit 12.

The control unit 12, which is mainly a sequencer unit, further includes a CPU which gives a command to the sequencer unit, a memory, a disk unit or the like (i.e., a so called computer). As will be described later, the entire control unit 12 controls each of the preheating unit 100, the first vapor deposition apparatus 200, and the second vapor deposition apparatus 300. For example, the control unit 12 controls electric power supplied to the electron guns 30, 31 and the heater 302 to form a thin film on the lens 20.

Accordingly, the control unit 12 is connected not only to an input section 12a including a key board, a mouse or the like, but also to the devices to be controlled such as the electron guns 30, 31, the shutter 5, the vacuum unit 8, the heater 9, the ion gun 14, the gas generation unit 15 and the like as described above, and sensors such as the substrate thermometer 6, the vacuum meter 7, the optical film thickness meter 10 (the film thickness monitor 11) and the like. The control unit 12 controls the above-described devices to be controlled based on information input from each sensor or the like. Further, the control unit 12 is connected to the heater 102 of the preheating unit 100, the heater 302 of the second vapor deposition apparatus 300, the transfer means 500 which transfers the coating dome 2 from the preheating unit 100 via the first vapor deposition apparatus 200 to the second vapor deposition apparatus 300, and lifting and lowering units (not shown) for the opening and closing tables 103, 303 of the preheating unit 100 and the second vapor deposition apparatus 300, respectively.

The control unit 12 controls the vacuum unit 8 based on the information from the vacuum meter 7 to set degree of vacuum in the vapor deposition chamber 201 to a predetermined degree of vacuum. The control unit 12 also controls the heater 9 based on the information from the substrate thermometer 6 to set the temperature of the lens 20, which is a film-formed body, to a predetermined temperature. In addition, the control unit 12 sometimes controls the electric power (current and/or voltage) applied to the electron guns 30, 31 so that the light quantity value at each moment which depends on the optical film thickness of a thin film at each moment formed on the monitor glass 51 of the above-described optical film thickness meter 10 equals to a value stored in the reference light quantity value data storage means. In addition, the control unit 12 performs ion beam irradiation with use of the ion gun 14 and filling of gas with use of the gas generation unit 15 in accordance with a type of the thin film to be formed and types of the vapor deposition materials 41, 42 to be evaporated.

Herein, the coating dome 2 works as holding means which holds the lens 20 so that the antireflective film or the like is vapor deposited on the lens 20. Further, the coating dome 2 is disk-shaped with a curved surface, which has a predetermined curvature, so that a plurality of the lenses 20 can be simultaneously vapor deposited. In addition, the coating dome 2 is rotatable by an actuator which is not shown. It rotates mainly for reducing variation in distribution of vaporized substances which are heated, vaporized and dispersed in the vapor deposition chamber 201.

The electron guns 30, 31 evaporate the vapor deposition materials (substances) 41, 42 housed in the container by heating them to the melting temperatures of the vapor deposition materials 41, 42, thereby to vapor deposit/deposit the vapor deposition materials (substances) on the lens 20 and the monitor glass 51 so as to form a thin film. Meanwhile, the container 40 is a water-cooled type crucible or hearth liner which is used for holding the vapor deposition materials 41, 42.

The shutter 5 for the electron gun is controlled so as to be open when vapor deposition is initiated and be closed when it is ended. The shutter 5 facilitates control of a thin film. The heater 9 is heating means for heating the lens 20 to an appropriate temperature to improve property such as adhesiveness of the thin film to be vapor deposited on the lens 20.

The optical film thickness meter 10 irradiates light at a predetermined wavelength to the monitor glass 51 held at a substantially central portion of the coating dome 2, and measures the reflected light thereof. Since a thin film formed on the monitor glass 51 is thought to be dependent on a thin film formed on each of the lenses 20, the information that enables predicting (reproducing) a thin film formed on each of the lenses 20 can be obtained. The thickness of the film formed on the monitor glass 51 is measured based on the number of peaks of the light quantity detected by the light-receiving sensor, whereby progress of film formation can be detected.

In the meantime, the ion gun system 60 including the ion gun 14 installed in the vapor deposition chamber 201 of the above-described first vapor deposition apparatus 200, as described above, assists vapor deposition on the lens 20 by an ion beam irradiated from the ion gun 14, and improves film quality such as strength and denseness of a vapor-deposited thin film. The ion gun system 60, as shown in FIGS. 2 and 3, includes the ion gun 14, the electric power supply unit 61, gas cylinders 62 and 63, mass flow regulators 64 and 65, and the control unit 12.

The above-described electric power supply unit 61 supplies electric power to the ion gun 14. In addition, each of the gas cylinders 62 and 63 stores a single type of gas or a mixture of gases (for example, $O_2$ gas, Ar gas). Alternatively, the gas cylinders may be one type of the gas cylinder or three or more types of the gas cylinder each of which stores a single type of gas or a mixture of gases. In addition, the mass flow regulator 64 and the mass flow regulator 65 adjust flow rates of gas from the gas cylinder 62 to the ion gun 14, and gas from the gas cylinder 63 to the ion gun 14, respectively. Alternatively, one mass flow regulator or three or more mass flow regulators may be installed corresponding to the number of the gas cylinders.

The control unit 12 is connected to the electric power supply unit 61, and the mass flow regulators 64 and 65. As functions related to the ion gun system 60, the control unit 12 has a function as the ion gun control means, and a function as mass flow control means. The function as the ion gun control means is to control electric power supplied to the ion gun 14 from the electric power supply unit 61. The control includes controlling turning ON and OFF of the electric power supply to the ion gun 14. The function as the mass flow control means is to control the flow rate of gas introduced in the ion gun 14 from the mass flow regulators 64, 65, respectively.

In the meantime, in the first vapor deposition apparatus 200, the multi-layer antireflective film formed on the lens 20 according to the ion-assisted method with use of the ion gun system 60 includes laminated high-refractive-index layers and low-refractive-index layers. For such multi-layer antireflective films, there are some cases where the film formation conditions for forming the low-refractive-index layer and the film formation conditions for forming the high-refractive-index layer are different. Accordingly, it is necessary to change the above-described film formation conditions during a period between when forming these films. The above-described film formation conditions are set value for each of the acceleration current, the acceleration voltage, and a bias current supplied from the electric power supply unit 61 to the ion gun 14, and a set value for flow rate of one gas or for flow rates of each of a plurality of types of gases (two types in the present embodiment) introduced in the ion gun 14 via the mass flow regulators 64, 65.

Then, the control unit 12 which functions as the ion gun control means changes the set value for the flow rate of each of a plurality of types of gas (for example, $O_2$ gas, Ar gas) to another intended set value by changing it stepwise within a range where the ion gun 14 is working stably. For example, the control unit 12 which functions as the ion gun control means changes the flow rate of the above-described two types of gas stepwise within a range where the ion gun 14 is working stably, while synchronizing the set values rather than independently. Examples of synchronization in this case include increasing the flow rate of one of gases and subsequently decreasing the flow rate of the other gas, and changing the flow rate of each gas in the state where the total flow rate of the both gases is kept to a constant flow rate.

In addition, the control unit 12 which functions as the mass flow control means changes the set value for each of the acceleration current, the acceleration voltage, and the bias current supplied to the ion gun 14 to another intended set value by changing it stepwise within a range where the ion gun 14 is working stably. In this case, the control unit 12 which functions as the mass flow control means may temporarily set the set value for each of the acceleration current, the acceleration voltage, and the bias current to a value within a range of a power-down set value (30 mA≤the acceleration current≤70 mA, 100V≤the acceleration voltage≤160V, 50 mA≤the bias current≤120 mA) by changing it stepwise within a range where the ion gun 14 is working stably (that is, decrease the power), and subsequently change it stepwise to another intended set value. The power-down may be executed as appropriately, or may be omitted.

Because of the above-described power-down, even if an error occurs in other equipment in the first vapor deposition apparatus 200 during the power-down, the output from the ion gun 14 has already been reduced. Accordingly, a negative influence of the ion beam irradiated from the ion gun 14 on the vapor-deposited thin film layer can be avoided. In addition, a negative influence on the vapor-deposited thin film layer can be reliably avoided by closing a shutter 66 for the ion gun (FIG. 2), for example, during the above-described power-down in order to block the ion beam from the ion gun 14.

In addition, change of the setting values for the above-described acceleration current, the acceleration voltage, and the bias current and change of the setting value for the flow rate of gas to be introduced are implemented in parallel processing and simultaneously. As a result, a total time for changing the above-described set values for the ion gun 14 is reduced.

In addition, change of the set values for the acceleration current, the acceleration voltage, and the bias current is to change each of the above-described set values separately per a divided unit time determined by dividing a total change time, so as to change each of the above-described set values stepwise within the total change time. In a similar manner, change of the set value for the flow rate of gas is to change each of the above-described set values separately per a divided unit time determined by dividing a total change time, so as to change each of the above-described set values stepwise within the total change time.

The above-described total change time is set to be within a range of an inter-layer treatment time required for a period between when forming different vapor deposition layers (the low-refractive-index layer and the high-refractive-index layer) without implementing assist with use of the ion gun 14. The inter-layer treatment time includes a time for heating the electron gun, a time for opening and closing the shutter for the electron gun, and a time for changing the setting for the film thickness meter, and the like that are required for a period between when forming different vapor deposition layers. Specifically, the above-described inter-layer treatment time is approximately within 12 to 30 seconds. Therefore, the total change time is set to at least within 30 seconds, and, preferably, approximately 10 to 20 seconds. In addition, the above-described divided unit time is set to within 1 second, and preferably, to approximately 200 to 300 m seconds to keep a stable working state of the ion gun system 60. This is because if the time exceeds 1 second, the ion gun 14 will become unstable, which may lead to abnormal stoppage.

The above-described total change time, the divided unit time, and the number of division are set based on an allowable temporary change range and an allowable division change range. Herein, the allowable temporary change range is a range of change allowed per second for stable working of the ion gun system 60. The allowable division change range is a range of change allowed per 1 division for stable working of the ion gun system 60.

The above-described allowable temporary change range is as follows: the flow rate of gas to be introduced is usually equal to or less than 4.0 sccm/second, and preferably, equal to or less than 2.0 to 3.0 sccm/second, the acceleration current is equal to or less than 70 mA/second, preferably, equal to or less than 40 mA/second, the acceleration voltage is equal to or less than 140 V/second, preferably, equal to or less than 80 V/second, and the bias current is 120 mA/second, preferably, equal to or less than 70 mA/second. The above-described "sccm" which is the abbreviation of "Standard cc/min," refers to a volume of gas which flows for a minute under the environment of 1 atm (atmospheric pressure, 101.3 kPa), and 20° C.

The allowable division change range is as follows: the flow rate of gas to be introduced is usually equal to or less than 0.2 sccm/division, preferably, equal to or less than 0.05 to 0.1 sccm/division, the acceleration current is equal to or less than 3.0 mA/division, preferably, equal to or less than 1.0 mA/division, the acceleration voltage is equal to or less than 6.0 V/division, preferably, equal to or less than 2.0 V/division, and the bias current is 5.1 mA/division, preferably, equal to or less than 1.7 mA/division.

For example, in the case of changing the set value for the acceleration voltage from 200 V to 600 V, it requires approximately 3 seconds for the total change time, and thus the total change time is set as 4 seconds to be on a safe side, based on the fact that the allowable temporary change range is equal to or less than 140 V/second. In this way, when it is assumed that the set value for the acceleration voltage is changed from 200 V to 600 V for 4 seconds, there should be a change of 100 V per second. At this time, the number of division for which change of 100 V per second is allowed is determined by 100 V÷6.0 V, and to be on a safer side by 100 V÷5.0 V=20 divisions, based on the fact that the allowable division change range is equal to or less than 6.0 V/division. Therefore, the divided unit time should be 0.05 second. As a result of this, in the case of changing the set value for the acceleration voltage from 200 V to 600 V in 4 seconds, the number of division should be 20 divisions×4=80 divisions.

Next, the process (FIG. 4) of forming a multi-layer antireflective film on the lens 20 with use of the ion gun system 60 will be explained through comparison with the conventional process (FIG. 5). As shown in FIGS. 3 and 4, first, the control unit 12 sets the set value for the flow rate of gas to be introduced to a set value A1 for the mass flow regulators 64 and 65 (S1). Next, the control unit 12 gives a command to the mass flow regulators 64 and 65 to start introducing a gas at this mass flow rate (S2). In fact, the set values for the flow rates of gas are actually different for the mass flow regulators 64 and 65, and the different set values for the flow rate of gas are collectively referred to as the set value A1. The same is applied for a set value A2 to be hereinafter described.

At the time point when the mass flow regulators 64 and 65 have adjusted the set value A1 for the flow rate of gas to be introduced in the ion gun 14, the control unit 12 sets the set values for the acceleration current, the acceleration voltage, and the bias current to a set value B1 in the electric power supply unit 61 (S3). Next, the control unit 12 gives a command to the electric power supply unit 61 to activate the ion gun 14 (S4). In fact, the above-described set values for the acceleration current, the acceleration voltage, and the bias current are also different, and the different set values for them are collectively referred to as the set value B1. The same is applied for a set value B2 to be hereinafter described.

At the time point when the electric power supply unit 61 has adjusted the acceleration current, the acceleration voltage and the bias current supplied to the ion gun 14 to the set value B1, the vapor deposition material 41 is vapor deposited on the surface of the lens 20 to form the low-refractive-index layer (S5) due to the action of the electron guns 30, 31 and the ion gun 14.

After completion of formation of the low-refractive-index layer, the control unit 12 changes the set value for the flow rate of gas to be introduced to the set value A2 in the mass flow regulators 64 and 65 (S6). The mass flow regulators 64 and 65 adjust the flow rate of gas introduced in the ion gun 14 to the set value A2.

In parallel with the change of the setting value for the flow rate of gas to be introduced and the adjustment to the set value A2 for the flow rate of gas to be introduced, the control unit 12 changes the set values for the acceleration current, the acceleration voltage, and the bias current to the power-down set values in the electric power supply unit 61 (S7). The electric power supply unit 61 adjusts the acceleration current, the acceleration voltage, and the bias current supplied to the ion gun 14 to the power-down set values. Subsequently, the control unit 12 sets the set values for the acceleration current, the acceleration voltage, and the bias current to the set value B2 in the electric power supply unit 61 (S8). The electric power supply unit 61 adjusts the acceleration current, the acceleration voltage, and the bias current supplied to the ion gun 14 to the set value B2.

Under this state, the vapor deposition material 42 is vapor deposited on the surface of the lens 20 to form the high-refractive-index layer (S9) due to the action of the electron guns 30, 31 and the ion gun 14. After completion of formation of the high-refractive-index layer, the control unit 12 changes the set value for the flow rate of gas to be introduced to the set value A1 in the mass flow regulators 64 and 65 (S10). The mass flow regulators 64 and 65 adjust the flow rate of gas introduced in the ion gun 14 to the set value A1.

In parallel with the change of the setting value for the flow rate of gas to be introduced and the adjustment to the set value A1 for the flow rate of gas to be introduced, the control unit 12 changes the set values for the acceleration current, the acceleration voltage, and the bias currents to the power-down set value in the electric power supply unit 61 (S11). The electric power supply unit 61 adjusts the acceleration current, the acceleration voltage, and the bias current supplied to the ion gun 14 to the above-described power-down set value. Subsequently, the control unit 12 sets the set values for the acceleration current, the acceleration voltage, and the bias current to the set value B1 in the electric power supply unit 61 (S12). The electric power supply unit 61 adjusts the acceleration current, the acceleration voltage, and the bias current supplied to the ion gun 14 to the set value B1.

Under this state, the vapor deposition material 41 is vapor deposited on the surface of the lens 20 to form the low-refractive-index layer (S13) due to the action of the electron guns 30, 31 and the ion gun 14. Subsequently, the control unit 12 judges whether or not to further provide a layer on the lens 20 (S14). In the case of not to provide one, the control unit 12 terminates the film formation process. In the case of further providing a high-refractive-index layer, the control unit 12 proceeds to steps S6 and S7.

Note that the power down in steps S7 and S11 may be omitted. In this case, in steps S8 and S12, the set values for the acceleration current, the acceleration voltage, and the bias current are changed stepwise to the set values required for vapor deposition of the next layer (the low-refractive-index layer and the high-refractive-index layer) without being reduced to the power-down set value.

On the contrary, in the conventional film formation process (FIG. 5), steps S21 to S24, which are the same as steps S1 to S4 (FIG. 4) of the present embodiment, form the low-refractive-index layer on the lens 20 (S25). After completion of formation of the low-refractive-index layer, the control unit 12 gives a command to the electric power supply unit 61 to stop the ion gun 14 (S26), and stops introduction of gas by the mass flow regulators 64 and 65 (S27).

Next, in steps S28 to S31, in the similar manner as the above-described steps S21 to S24, the control unit 12 changes the set value for the flow rate of gas to the set value A2 (S29), and adjusts the flow rate of gas to the set value A2. Further, the control unit 12 changes the set values for the acceleration current, the acceleration voltage, and the bias current to the set value B2 (S31), and adjusts the acceleration current, the acceleration voltage, and the bias current to the set value B2.

Under this state, the high-refractive-index layer is formed on the lens 20 (S32). After completion of formation of the high-refractive-index layer, the control unit 12 gives command to the electric power supply unit 61 to stop the ion gun 14 (S33), and stops introduction of gas by the mass flow regulators 64 and 65 (S34). Next, in steps S35 to S38, the control unit 12 executes the processes similar to steps S21 to S24, thereby to form the low-refractive-index layer on the surface of the lens 20 (S39).

After completion of formation of the low-refractive-index layer, the control unit 12 gives a command to the electric power supply unit 61 to stop the ion gun 14 (S40), and stops introduction of gas by the mass flow regulators 64 and 65 (S41). The control unit 12 judges whether or not to further provide another layer on the surface of the lens 20 (S42). In the case of not to provide it, the control unit 12 terminates the film formation process. Further, in the case of providing a high-refractive-index layer, the control unit 12 proceeds to step S28.

As constructed as described above, the above-described embodiment gives the following operational effects.

(1) The control unit 12 which functions as the mass flow control means is provided with a function of changing the set value for the flow rate of gas to be introduced for the mass flow regulators 64 and 65 to another intended set value by changing it stepwise within a range where the ion gun 14 is working stably. In this way, in the mass flow regulators 64 and 65, the control unit 12 changes stepwise the set value for the flow rate of gas to another set value, without changing the set value to another set value after temporarily stopping introduction of gas by the mass flow regulators 64 and 65. Therefore, film formation time for forming a multi-layer antireflective film on the lens 20 with use of the ion gun system 60 can be reduced without deteriorating performance of the film. In addition, stable working of the ion gun 14 is ensured when changing the set value for the flow rate of gas to be introduced. Therefore, a situation where the ion gun 14 abnormality stops when the set value is changed can be reliably avoided.

(2) The control unit 12 which functions as the ion gun control means changes the set value for each of the acceleration current, the acceleration voltage, and the bias current in the electric power supply unit 61 to another intended set value by changing it stepwise within a range where the ion gun 14 is working stably. In this way, the control unit 12 changes stepwise the set value for each of the acceleration current, the acceleration voltage, and the bias current for the electric power supply unit 61 to another set value, without setting the set value to another set value after giving a command to the electric power supply unit 61 to temporarily stop the ion gun 14. Therefore, film formation time for forming a multi-layer antireflective film on the lens 20 with use of the ion gun system 60 can be reduced without deteriorating performance of the film. In addition, stable working of the ion gun 14 is ensured when changing the set value for each of the acceleration current, the acceleration voltage, and the bias current. Therefore, a situation where the ion gun 14 abnormality stops when changing these set values can be reliably avoided.

(3) The control unit 12 which functions as the ion gun control means executes a so-called power-down in which it sets the set value for each of the acceleration current, the acceleration voltage, and the bias current supplied to the ion gun 14 to the power-down set value temporarily, before setting it to another set value for vapor deposition of the layer (the low-refractive-index layer and the high-refractive-index layer). Accordingly, even if an error occurs in other equipment while the power-down is being executed, a negative influence of the prion beam irradiated from the ion gun 14 on the low-refractive-index layer and the high-refractive-index layer that have already formed on the lens 20 can be avoided as much as possible.

(4) Change of the setting values for the acceleration current, the acceleration voltage, and the bias current supplied to the ion gun 14 by the control unit 12 which functions as the ion gun control means, and change of the setting value for the flow rate of gas introduced in the ion gun 14 by the control unit 12 which functions as the mass flow control means are implemented in parallel processing and simultaneously. As a result, a total time for changing the set values can be reduced and film formation time can be reduced.

EXAMPLES

Hereinafter, the present invention will be further explained with reference to Examples.

With use of an ion beam from an ion gun, a low-refractive-index layer and a high-refractive-index layer were laminated through vapor deposition on a surface of a plastic lens to form a multi-layer antireflective film. As show in Table 1, the first layer, the third layer, the fifth layer and the seventh layer are low-refractive-index layers, and the second layer, the fourth layer and the sixth layer are high-refractive-index layers. The eighth layer is a water proof coat.

Epolite as a vapor deposition material for the low-refractive-index layer is propylene glycoldiglycidylether, with molecular weight 188, manufactured by Kyoeisha Chemical Co., Ltd. In Table 1, M1 refers to an inorganic substance, and CM2 refers to a non-silicon containing organic compound.

As shown in Table 1, the film formation conditions for the ion gun (set value for each of the flow rate of gas introduced in the ion gun, the acceleration current, the acceleration voltage, and the bias current) are greatly different between when a low-refractive-index layer is vapor deposited and when a high-refractive-index layer is vapor deposited, and they are changed each time when a layer is vapor deposited. Although not shown in Table 1, the power-down set values in Examples 1 and 2 are as follows: the acceleration current 60 mA, the acceleration voltage 120 V, and the bias current 100 mA.

In the present Examples 1 and 2, the total change time was 5 seconds, the divided unit time was 25 m seconds, and the number of division was 200 times, when changing the set values for the acceleration current, the acceleration voltage, and the bias current when the low-refractive-index layer or the high-refractive-index layer is vapor deposited to the above-described power-down set value. Further, the total change time was 5 seconds, the divided unit time was 25 m seconds, and the number of division was 200 times, when changing the set values for the flow rate of gas to be introduced between when the low-refractive-index layer is vapor deposited and the high-refractive-index layer is vapor deposited. In this way, change of the various set values as described above was implemented smoothly.

TABLE 1

| | EXAMPLE 1 | | | | EXAMPLE 2 | | | |
|---|---|---|---|---|---|---|---|---|
| PRE-TREATMENT ION GUN SETTING CONDITIONS | TREATMENT TIME 45 SECONDS | | ACCELERATION VOLTAGE<br>ACCELERATION TEMPERATURE<br>$O_2$:<br>Ar: | 420 V<br>210 mA<br>10 sccm<br>10 sccm | TREATMENT TIME 120 SECONDS | | ACCELERATION VOLTAGE<br>ACCELERATION TEMPERATURE<br>$O_2$:<br>Ar: | 350 V<br>210 mA<br>10 sccm<br>10 sccm |
| GAS TO BE USED | MATERIAL USED, FILM THICKNESS, ETC. | | ION GUN SET VALUE | | MATERIAL USED, FILM THICKNESS, ETC. | | ION GUN SET VALUE | |
| THE FIRST LAYER | FILM THICKNESS<br>REFLECTIVITY<br>M1 SiO$_2$<br>CM2 EPOLITE 70P | 0.0540 λ<br>1.4630<br>14 ccm | ACCELERATION VOLTAGE<br>ACCELERATION TEMPERATURE<br>$O_2$:<br>Ar: | 500 V<br>250 mA<br>10 sccm<br>10 sccm | FILM THICKNESS<br>REFLECTIVITY<br>M1 SiO$_2$<br>CM2 EPOLITE 70P | 0.0792 λ<br>1.4580<br>14 ccm | ACCELERATION VOLTAGE<br>ACCELERATION TEMPERATURE<br>$O_2$:<br>Ar: | 200 V<br>120 mA<br>10 sccm<br>10 sccm |
| THE SECOND LAYER | FILM THICKNESS<br>REFLECTIVITY<br>Ta$_2$O$_5$ | 0.0380 λ<br>1.9700 | ACCELERATION VOLTAGE<br>ACCELERATION TEMPERATURE<br>$O_2$: | 200 V<br>100 mA<br>20 sccm | FILM THICKNESS<br>REFLECTIVITY<br>Nb$_2$O$_5$ | 0.0236 λ<br>2.1950 | ACCELERATION VOLTAGE<br>ACCELERATION TEMPERATURE<br>$O_2$: | 450 V<br>200 mA<br>20 sccm |
| THE THIRD LAYER | FILM THICKNESS<br>REFLECTIVITY<br>M1 SiO$_2$<br>CM2 EPOLITE 70P | 0.550 λ<br>1.4630<br>14 ccm | ACCELERATION VOLTAGE<br>ACCELERATION TEMPERATURE<br>$O_2$:<br>Ar: | 500 V<br>250 mA<br>10 sccm<br>10 sccm | FILM THICKNESS<br>REFLECTIVITY<br>M1 SiO$_2$<br>CM2 EPOLITE 70P | 0.6357 λ<br>1.4580<br>14 ccm | ACCELERATION VOLTAGE<br>ACCELERATION TEMPERATURE<br>$O_2$:<br>Ar: | 200 V<br>120 mA<br>10 sccm<br>10 sccm |
| THE FOURTH LAYER | FILM THICKNESS<br>REFLECTIVITY<br>Ta$_2$O$_5$ | 0.1376 λ<br>1.9700 | ACCELERATION VOLTAGE<br>ACCELERATION TEMPERATURE<br>$O_2$: | 200 V<br>100 mA<br>20 sccm | FILM THICKNESS<br>REFLECTIVITY<br>Nb$_2$O$_5$ | 0.1055 λ<br>2.1950 | ACCELERATION VOLTAGE<br>ACCELERATION TEMPERATURE<br>$O_2$: | 450 V<br>200 mA<br>20 sccm |
| THE FIFTH LAYER | FILM THICKNESS<br>REFLECTIVITY<br>M1 SiO$_2$<br>CM2 EPOLITE 70P | 0.0494 λ<br>1.4630<br>14 ccm | ACCELERATION VOLTAGE<br>ACCELERATION TEMPERATURE<br>$O_2$:<br>Ar: | 500 V<br>250 mA<br>10 sccm<br>10 sccm | FILM THICKNESS<br>REFLECTIVITY<br>M1 SiO$_2$<br>CM2 EPOLITE 70P | 0.1107 λ<br>1.4580<br>14 ccm | ACCELERATION VOLTAGE<br>ACCELERATION TEMPERATURE<br>$O_2$:<br>Ar: | 200 V<br>120 mA<br>10 sccm<br>10 sccm |
| THE SIXTH LAYER | FILM THICKNESS<br>REFLECTIVITY<br>Ta$_2$O$_5$ | 0.2787 λ<br>1.9770 | ACCELERATION VOLTAGE<br>ACCELERATION TEMPERATURE<br>$O_2$: | 230 V<br>130 mA<br>20 sccm | FILM THICKNESS<br>REFLECTIVITY<br>Nb$_2$O$_5$ | 0.1538 λ<br>2.1950 | ACCELERATION VOLTAGE<br>ACCELERATION TEMPERATURE<br>$O_2$: | 450 V<br>200 mA<br>20 sccm |
| THE SEVENTH LAYER | FILM THICKNESS<br>REFLECTIVITY<br>M1 SiO$_2$<br>CM2 EPOLITE 70P | 0.2497 λ<br>1.4630<br>14 ccm | ACCELERATION VOLTAGE<br>ACCELERATION TEMPERATURE<br>$O_2$:<br>Ar: | 500 V<br>250 mA<br>10 sccm<br>10 sccm | FILM THICKNESS<br>REFLECTIVITY<br>M1 SiO$_2$<br>CM2 EPOLITE 70P | 0.2885 λ<br>1.4580<br>14 ccm | ACCELERATION VOLTAGE<br>ACCELERATION TEMPERATURE<br>$O_2$:<br>Ar: | 400 V<br>200 mA<br>10 sccm<br>10 sccm |
| THE EIGHTH LAYER PRE- | TREATMENT TIME 45 SECONDS | | ACCELERATION VOLTAGE<br>ACCELERATION | 200 V<br>120 mA | TREATMENT TIME 45 SECONDS | | ACCELERATION VOLTAGE<br>ACCELERATION | 200 V<br>120 mA |

TABLE 1-continued

| | EXAMPLE 1 | | EXAMPLE 2 | |
|---|---|---|---|---|
| TREATMENT ION GUN SETTING CONDITIONS | TEMPERATURE $O_2$: Ar: | 5 sccm 15 sccm | TEMPERATURE $O_2$: Ar: | 5 sccm 15 sccm |

Hereinabove, the present invention has been explained based on the embodiment and examples. However, the present invention is not limited to these.

Figure 1:
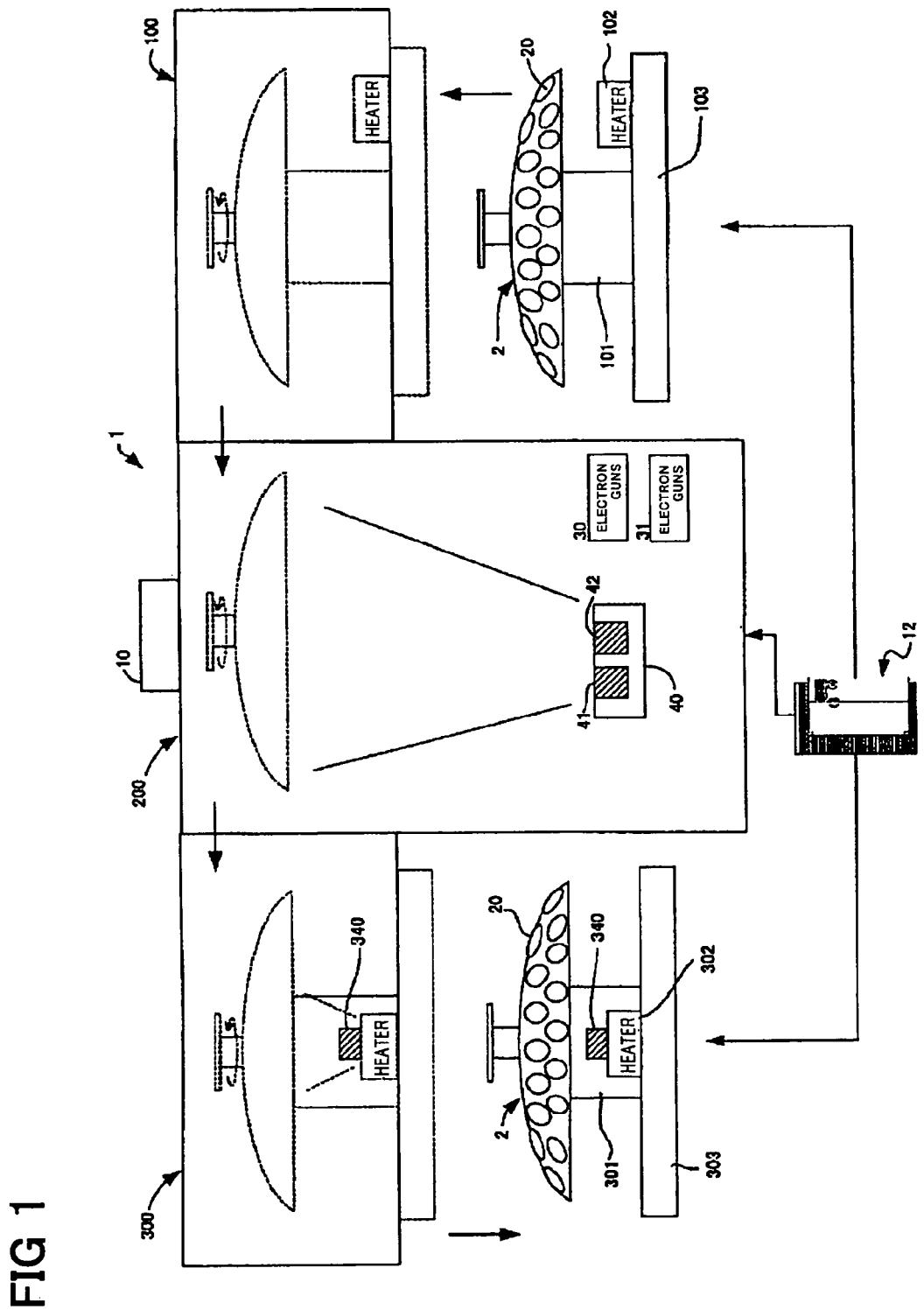
FIG. 1 is a schematic diagram showing a continuous vapor deposition system in which one embodiment of the method for producing a lens according to the present invention has been applied.
Figure 2:
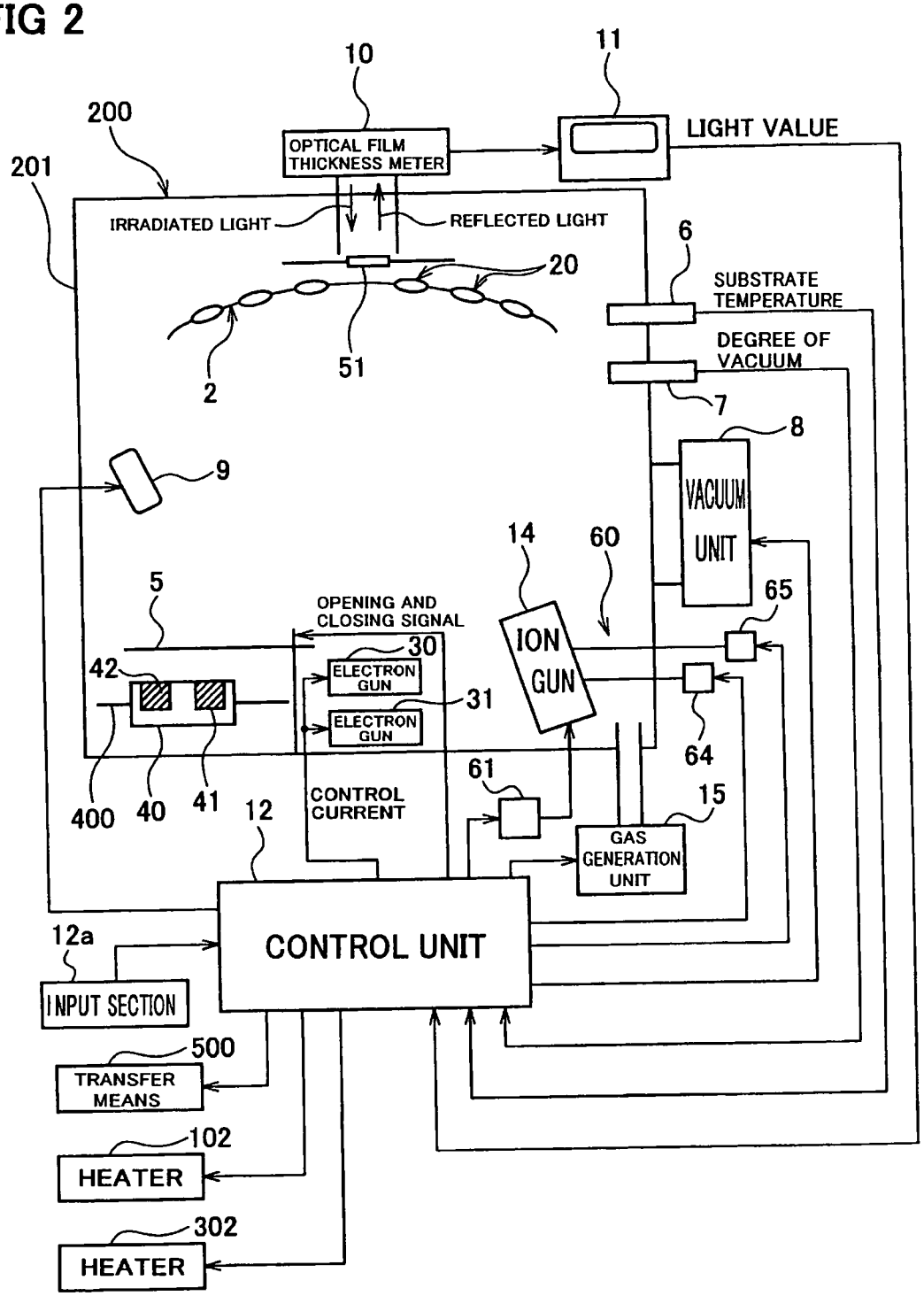
FIG. 2 is a configuration diagram showing a first vapor deposition apparatus in FIG. 1.
Figure 3:
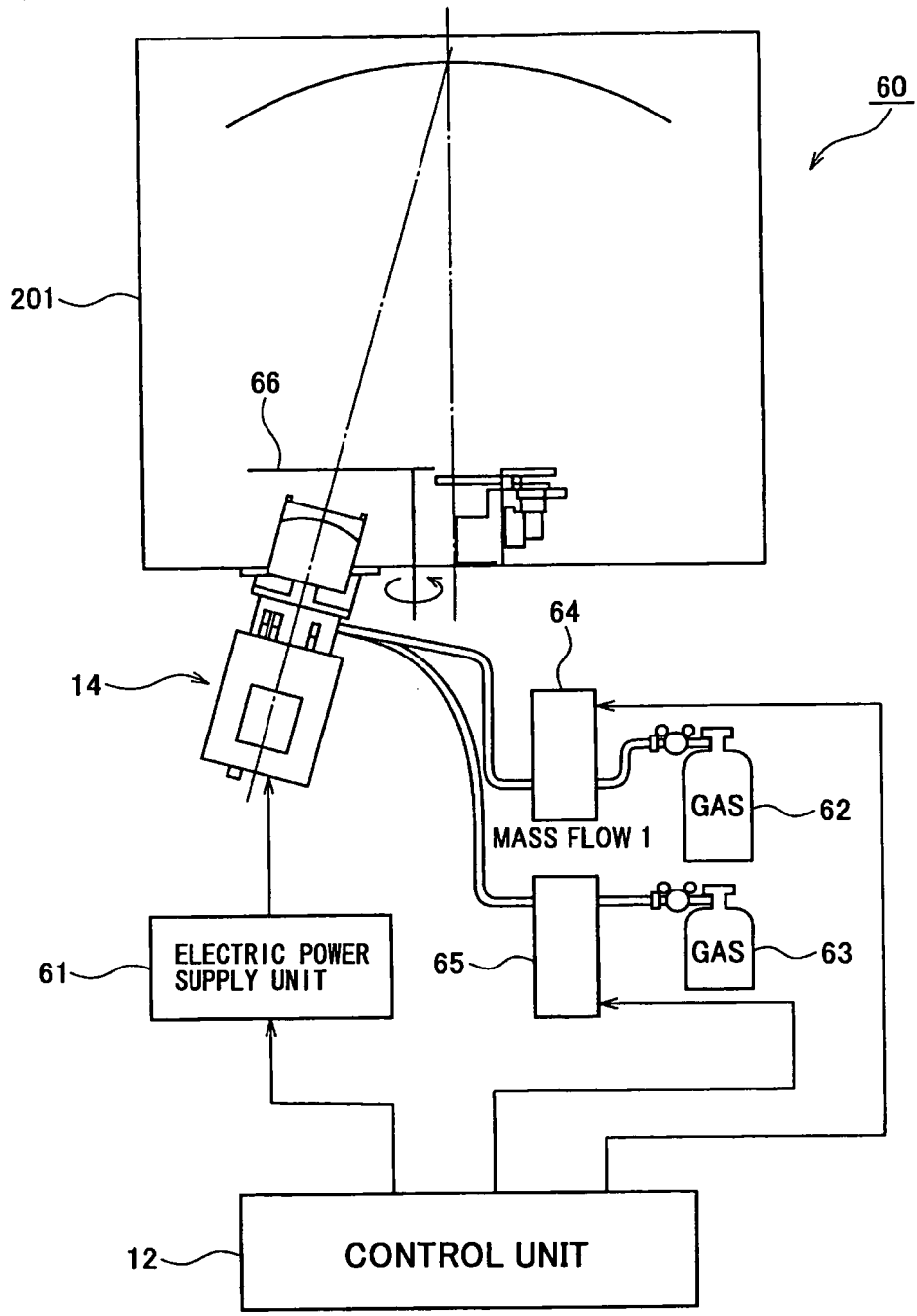
FIG. 3 is a configuration diagram showing an ion gun system in FIG. 2.
Figure 4:
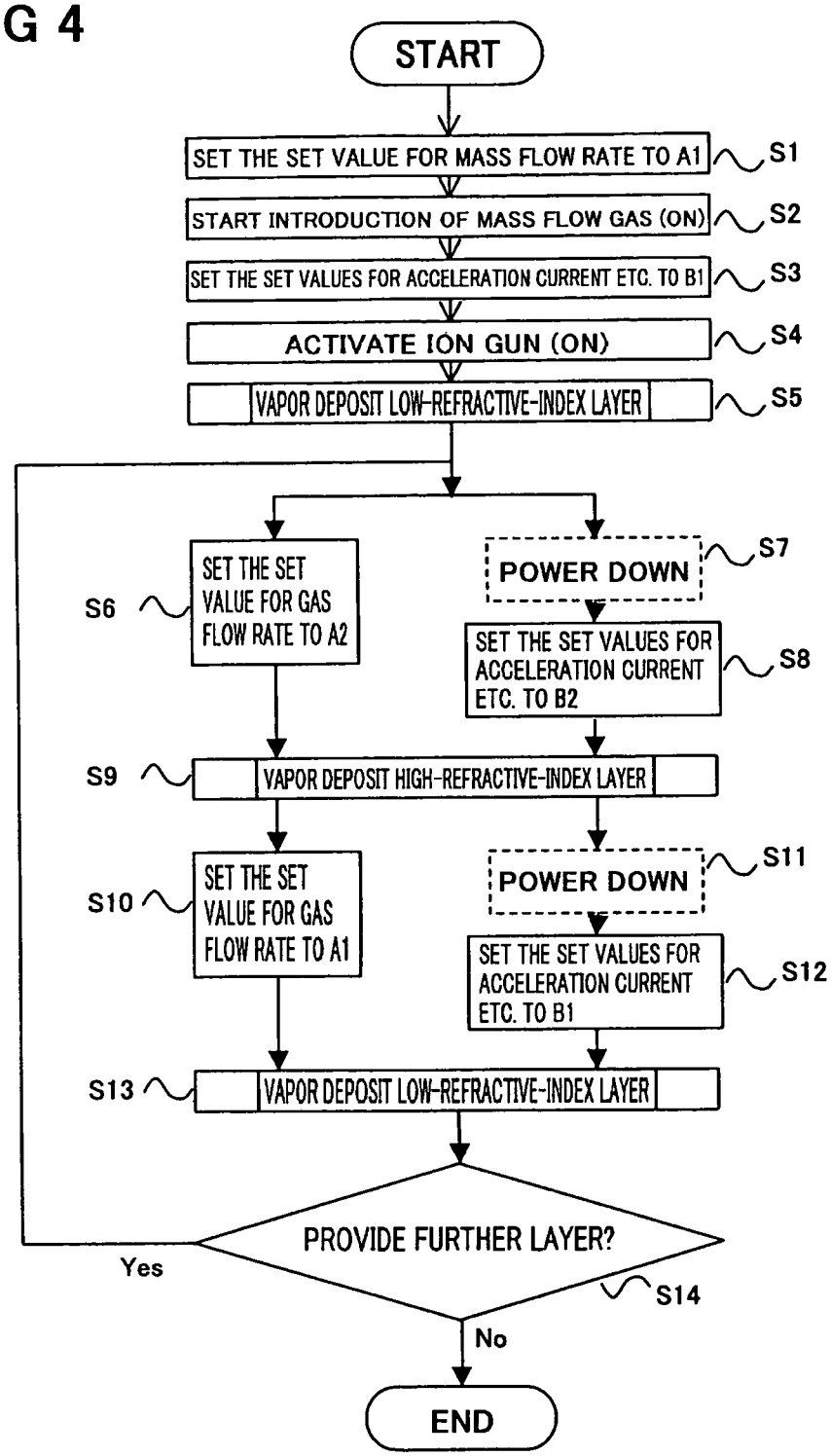
FIG. 4 is a flowchart showing a process of forming a multi-layer antireflective film on a lens with use of the ion gun system in FIG. 3.
Figure 5:
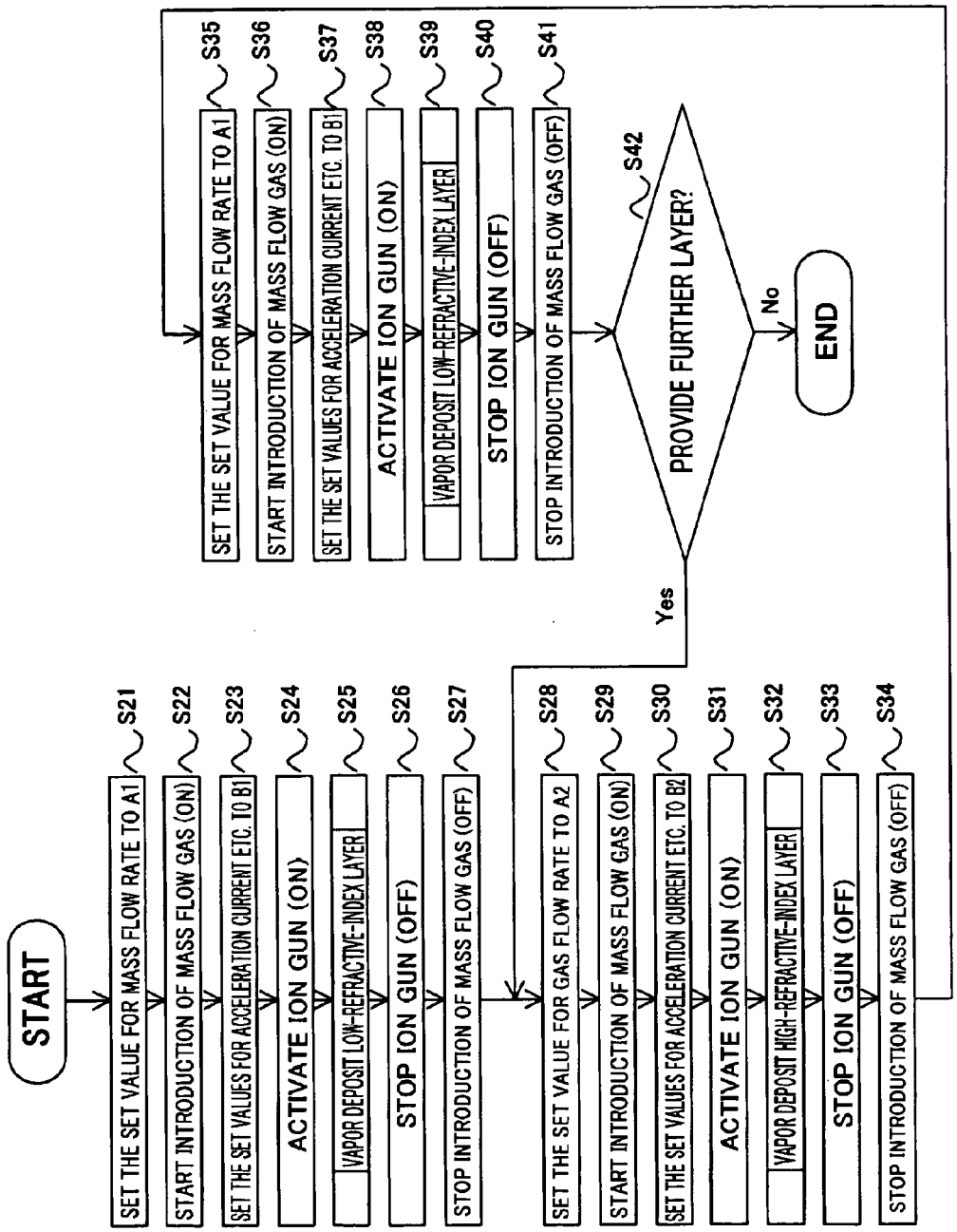
FIG. 5 is a flowchart showing a process of forming a multi-layer antireflective film on a lens with use of a conventional ion gun system.

DESCRIPTION OF SIGNS AND NUMERALS 12 control apparatus (ion gun control means, mass flow control means)
14 ion gun
20 lens (a film-formed body)
30,31 electric gun (a heat source)
60 ion gun system
61 electric power supply unit
64, 65 mass flow regulator
200 first vapor deposition apparatus
201 vapor deposition chamber.

The invention claimed is:

1. An ion gun system, comprising:
an ion gun configured to radiate an ion beam on an object;
an electric power supply unit configured to supply electric power to the ion gun;
a plurality of mass flow regulators configured to introduce a plurality of types of gas into the ion gun;
an ion gun control unit configured to control the electric power supplied to the ion gun from the electric power supply unit; and
a mass flow control unit configured to control flow rates of the plurality of types of gas introduced into the ion gun from the plurality of mass flow regulators,
wherein the mass flow control unit is configured to:
set first flow rate set values and second flow rate set values, the first flow rate set values indicating target flow rates of the plurality of types of gas for a first prescribed processing on the object and the second flow rate set values indicating target flow rates of the plurality of types of gas for a second prescribed processing on the object, and
directly change from the first flow rate set values to the second flow rate set values,
wherein the ion gun control unit is configured to change from first acceleration set values indicating target acceleration current value and target acceleration voltage value supplied to the ion gun during the first prescribed processing to second acceleration set values indicating target acceleration current value and target acceleration voltage value supplied to the ion gun during the second prescribed processing by changing each of the acceleration current value and the acceleration voltage value stepwise within a range of stable operation of the ion gun,
wherein at least one of the change by the ion gun control unit of the acceleration set values and the change by the mass flow control unit of the flow rate set values is executed so that the set values are changed separately per a divided unit time determined by dividing a total change time for the set values, so as to change the set values stepwise within the total change time, and
wherein the divided unit time is set to be a time period equal to or less than 1 second.

2. The ion gun system according to claim 1, wherein the mass flow control unit is configured to change from the first flow rate set values to the second flow rate set values by changing the flow rate of each of the plurality of types of gas over a plurality of steps while synchronizing a change timing of the flow rate of each of the plurality of types of gas so as to be within a range of stable operation of the ion gun.

3. The ion gun system according to claim 1, wherein the mass flow control unit is configured to change from the first flow rate set values to the second flow rate set values by changing the flow rate of each of the plurality of types of gas over a plurality of steps so as to be within a range of stable operation of the ion gun, while maintaining a constant total flow rate of the plurality of types of gas.

4. The ion gun system according to claim 1, wherein the ion gun control unit is configured to temporarily set each of the acceleration current value and the acceleration voltage value supplied to the ion gun to values that satisfy 30 mA≤the acceleration current value≤70 mA and 100 V≤the acceleration voltage value≤160 V from the first acceleration set values by changing each of the acceleration current value and the acceleration voltage value stepwise within a range of stable operation of the ion gun, and subsequently changing each of the acceleration current value and the acceleration voltage value stepwise to the second acceleration set values.

5. The ion gun system according to claim 1, wherein change by the ion gun control unit of the acceleration set values and change by the mass flow control unit of the flow rate set values are implemented in parallel.

6. A vapor deposition apparatus comprising:
a vapor deposition chamber configured to hold a film-formed body therein;
a heat source, installed in the vapor deposition chamber, configured to heat a vapor deposition material so as to evaporate it and deposit it on the film-formed body; and
an ion gun system, installed in the vapor deposition chamber, configured to assist the deposition of the vapor deposition material onto the film-formed body with an ion beam it radiates, wherein the ion gun system is an ion gun system according to claim 1.

7. The ion gun system according to claim 1, wherein the flow rate of each of the plurality of types of gas stays within a corresponding range having end points defined by the first and second flow rate set values.

8. The ion gun system according to claim 1, wherein:
the mass flow control unit is configured to directly change from the first flow rate set values to the second flow rate set values by changing the flow rate of each of the plurality of types of gas over a plurality of steps, and
a variation amount between each sequential pair of the steps is within a range of stable operation of the ion gun.

9. An ion gun system, comprising:
an ion gun configured to radiate an ion beam on an object;
an electric power supply unit configured to supply electric power to the ion gun;
a plurality of mass flow regulators configured to introduce a plurality of types of gas into the ion gun;
an ion gun control unit configured to control the electric power supplied to the ion gun from the electric power supply unit;
a mass flow control unit configured to control flow rates of the plurality of types of gas introduced into the ion gun from the plurality of mass flow regulators, and
a shutter configured to (i) block the ion beam from reaching the object when closed and (ii) allow the ion beam to reach the object when open,
wherein the mass flow control unit is configured to:
set first flow rate set values and second flow rate set values, the first flow rate set values indicating target flow rates of the plurality of types of gas for a first prescribed processing on the object and the second flow rate set values indicating target flow rates of the plurality of types of gas for a second prescribed processing on the object, and
directly change from the first flow rate set values to the second flow rate set values by changing the flow rate of each of the plurality of types of gas over a plurality of steps,
wherein a variation amount between each sequential pair of the steps is within a range of stable operation of the ion gun, and
wherein the shutter is open during the first prescribed processing and during the second prescribed processing.

10. The ion gun system according to claim 1, wherein:
the first prescribed processing is a processing for forming a first film by vapor depositing a first vapor deposition material on the object, and
the second prescribed processing is a processing for forming a second film that is different from the first film by vapor depositing a second vapor deposition material that is different from the first vapor deposition material on the object.

* * * * *